United States Patent [19]

Lynch et al.

[11] Patent Number: 4,565,771

[45] Date of Patent: * Jan. 21, 1986

[54] PRODUCTION OF GRAVURE PRINTING PLATES HAVING PLASTIC PRINTING LAYERS

[75] Inventors: John Lynch, Monsheim; Reinhold J. Leyrer, Ludwigshafen; Dietrich Saenger, Frankenthal, all of Fed. Rep. of Germany

[73] Assignee: BASF Aktiengesellschaft, Fed. Rep. of Germany

[*] Notice: The portion of the term of this patent subsequent to Jun. 26, 2001 has been disclaimed.

[21] Appl. No.: 525,509

[22] Filed: Aug. 22, 1983

[30] Foreign Application Priority Data

Aug. 21, 1982 [DE] Fed. Rep. of Germany ....... 3231144

[51] Int. Cl.[4] .................... G03C 5/16; G03C 1/495; G03C 1/72
[52] U.S. Cl. .................................... 430/307; 430/326; 430/330; 430/327; 430/328; 430/935; 430/927; 430/270; 430/280; 430/325; 430/331; 430/394
[58] Field of Search .............. 430/330, 325, 327, 328, 430/935, 927, 270, 280, 307, 326, 331, 394

[56] References Cited

U.S. PATENT DOCUMENTS

| 3,770,435 | 11/1973 | Volkert et al. | 430/307 |
|---|---|---|---|
| 3,926,636 | 12/1975 | Barzynski et al. | 430/285 |
| 4,035,189 | 7/1977 | Hayashi et al. | 430/280 |
| 4,187,107 | 2/1980 | Homma et al. | 430/307 |
| 4,456,679 | 6/1984 | Leyrer et al. | 430/280 X |
| 4,465,760 | 8/1984 | Leyrer et al. | 430/280 X |

FOREIGN PATENT DOCUMENTS

| 2150691 | 4/1973 | Fed. Rep. of Germany . | |
|---|---|---|---|
| 2302398 | 7/1974 | Fed. Rep. of Germany | 430/307 |
| 47-41361 | 3/1972 | Japan . | |
| 47-32684 | 8/1972 | Japan | 430/307 |
| 47-32683 | 8/1972 | Japan | 430/307 |
| 55102104 | 9/1978 | Japan | 430/307 |
| 54-4010A | 1/1980 | Japan | 430/307 |
| 1304835 | 1/1973 | United Kingdom | 430/307 |
| 1367921 | 9/1974 | United Kingdom . | |
| 1404497 | 8/1975 | United Kingdom | 430/270 |
| 1544748 | 4/1979 | United Kingdom . | |

*Primary Examiner*—John E Kittle
*Assistant Examiner*—Cynthia Hamilton
*Attorney, Agent, or Firm*—Keil & Weinkauf

[57] ABSTRACT

Gravure printing plates comprising a plastic printing layer applied on a printing plate base are produced by a method wherein a solid photosensitive layer (L) firmly bonded on the printing plate base is exposed imagewise to actinic light, and the exposed layer is washed out with a developer and then subjected to thermal hardening to form the plastic printing layer. In this process, the photosensitive layer (L) employed contains, as the photosensitive component, a compound possessing two or more aromatic and/or heteroaromatic o-nitrocarbinol ester groups, and a compound which effects crosslinking and possesses two or more reactive groups which are capable of reacting with —COOH groups under the action of heat to form a covalent chemical bond. After imagewise exposure, the layer is either washed out with an aqueous developer, post-exposed uniformly to actinic light and then subjected to thermal hardening and crosslinking, or subjected to selective thermal hardening and crosslinking in the exposed areas and then washed out with a developer.

20 Claims, No Drawings

PRODUCTION OF GRAVURE PRINTING PLATES HAVING PLASTIC PRINTING LAYERS

The present invention relates to a process for the production of gravure printing plates comprising a plastic printing layer applied to a printing plate base, by subjecting a solid photosensitive layer (L), which is applied to such a base, to imagewise exposure to actinic light, washing out the exposed layer (L) with a developer and subjecting the layer to thermal hardening to form a hard, abrasion-resistant and scratch-resistant plastic printing layer.

While, because they are easier to produce, photopolymeric relief printing plates are used extensively today in letterpress printing, gravure printing is still carried out using metal printing plates on the surface of which there is generally a chromium-plated copper layer which constitutes the actual printing layer and in which the depressions (wells) required to take up the ink are located. The high costs entailed in the production of such metal gravure printing plates have restricted gravure printing to applications which require high print quality and a long print run.

German Laid-Open Application No. DOS 2,752,500 discloses that gravure printing plates can be produced from plastic, the wells being engraved mechanically. To avoid the occurrence of scratches and grooves on the surface of these plates during printing, the conventional steel doctor plates are replaced by special plastic doctor plates. However, both the involved production of such plates and the print runs achievable with them are unsatisfactory.

The production of gravure printing plates by imagewise exposure of photopolymerizable mixtures, as used for the production of letterpress printing plates, is described in, for example, German Laid-Open Applications Nos. DOS 2,054,833 and 2,061,278 and Japanese Patent Application No. 41,361/72. However, the scratch resistance of the surfaces of such plates and the print runs achievable with them are unsatisfactory.

The copending U.S. patent application Ser. No. 400,136, filed July 16, 1982, of the same assignee, describes photopolymerizable recording materials for the production of gravure printing plates having abrasion-resistant and scratch-resistant plastic printing layers, which recording materials contain, in the photopolymerizable layer, hard, abrasive, finely divided particles. In order to achieve a hard, non-brittle photopolymer gravure printing plate, the copending U.S. patent application Ser. No. 400,069, filed July 20, 1982, of the same assignee proposes shrinking the photopolymer layer of the conventionally produced gravure printing plate by 10-50%, based on the thickness of the photopolymer layer, by baking at from 200° to 260° C. According to these two prior applications, abrasion-resistant and scratch-resistant gravure printing plates having plastic printing layers are produced from photopolymerizable materials which contain a polymeric binder, one or more photopolymerizable olefinically unsaturated compounds which are compatible with this binder, and a photoinitiator.

It is an object of the present invention to provide another simple process for the production of a gravure printing plate having a plastic printing layer, which process is flexible and generally applicable and gives printing plates having high abrasion-resistance and scratch-resistance coupled with very good printing properties in other respects.

We have found, surprisingly, that this object is achieved if the photosensitive layer used is applied to a printing plate base and contains a compound possessing two or more aromatic and/or heteroaromatic o-nitrocarbinol ester groups and a compound which effects crosslinking and possesses two or more reactive groups which are capable of reacting with —COOH groups to form a covalent chemical bond, and this photosensitive layer is exposed imagewise to actinic light and then either washed out with an aqueous developer, post-exposed uniformly to actinic light and subjected to thermal hardening and crosslinking, or subjected to selective thermal hardening and crosslinking in the exposed areas and then washed out with a developer.

The present invention accordingly relates to a process for the production of gravure printing plates having a plastic printing layer applied to a printing plate base, by subjecting a solid photosensitive layer (L), which is firmly bonded on the said base, to imagewise exposure to actinic light, washing out the exposed layer (L) with a developer and subjecting this layer to thermal hardening to form the hard and abrasion-resistant plastic printing layer, wherein the photosensitive layer (L) contains, as the photosensitive component, a compound possessing two or more aromatic and/or heteroaromatic o-nitrocarbinol ester groups of the general formula (I)

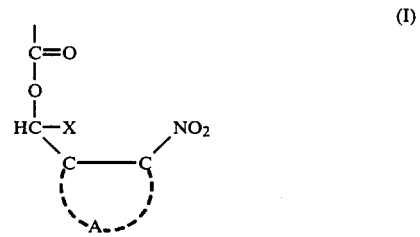

where A is the radical of an unsubstituted or substituted 5-membered to 14-membered aromatic or heteroaromatic ring system, and X is hydrogen, alkyl of 1 to 8 carbon atoms or an unsubstituted or substituted aryl or aralkyl radical, and wherein the said layer contains a compound which effects crosslinking and possesses two or more reactive groups, which, under the action of heat, are capable of reacting with —COOH groups to form a covalent chemical bond, and wherein the photosensitive layer (L) is exposed imagewise and then either washed out with an aqueous developer, post-exposed uniformly to actinic light and subjected to thermal hardening and crosslinking, or subjected to selective thermal hardening and crosslinking in the exposed areas and then washed out with a developer.

German Laid-Open Applications Nos. DOS 2,150,691 and 2,922,746 disclose photosensitive recording materials for use as photoresists or for the production of lithographic printing plates, which contain, as the photosensitive component, a polymer possessing aromatic and/or heteroatomatic o-nitrocarbinol ester groups. German Published Application No. 2,309,062 and German Laid-Open Application No. 2,242,394 describe curable photosensitive materials which comprise a compound possessing two or more o-nitrocarbinol ester groups and epoxides, isocyanates or aziridines and can be used for the production of photoresist layers or offset printing plates or of moldings, impregnations, coatings, coverings and printing inks. We have found, surprisingly, that photosensitive layers which contain a compound possessing two or more o-nitrocarbinol ester groups and a compound which effects crosslinking and possesses two or more groups which are reactive to carboxyl groups can be converted by the novel process to gravure printing plates of high quality. The gravure printing plates produced according to the invention not only have the same high abrasion resistance and scratch resistance as the conventional metal gravure printing, but also exhibit such good printing characteristics that they can be employed for quality gravure printing without entailing disadvantages or a reduction in quality. The gravure printing plates produced according to the invention can be employed in the conventional gravure printing presses, where they give very long print runs. Depending on the choice and sequence of the process steps, the novel process is extremely flexible and can as a result be readily adapted to the particular requirements of the user. Another important advantage of the novel process is that the exposed printing layer can be washed out with an aqueous developer without important properties of the plastic printing layer, eg. strength, resistance and hardness, being disadvantageously affected.

For the purposes of the present invention, gravure printing plates are printing plates, printing films or printing cylinders with relief forms which contain the ink-conveying image parts, which are required for the print, as depressions (wells) in the surface. In the gravure printing plates produced by the novel process, these depressions which take up the ink are located in the layer (L) which is generally firmly bonded on the dimensionally stable printing plate base, for example a metal plate or cylinder. The plastic printing layer, and hence the photosensitive layer (L), is in general from 5 to 500, preferably from 20 to 250, μm thick. The shallow wells are in general a few μm, eg. 2–3 μm, deep, and the deep wells are 10–100, in particular 20–60, μm deep.

To carry out the novel process, the photosensitive layer (L) is applied to the actual printing plate base, in general a metal plate or cylinder, by means of a conventional coating technique, either from solution, eg. by spin-coating, gravure-roller coating, dip coating, curtain coating, lip coating, etc., or by means of a conventional dry lamination process. Gravure printing cylinders can be coated continuously using a ring coater. To achieve good adhesion between the photosensitive layer (L) and the printing plate base, it is often advantageous if the latter is provided with a thin layer of an adhesion promoter, for example one based on polyurethane reactive binders, phenol resins and/or epoxy resins, before the layer (L) is applied.

In accordance with the invention, the photosensitive layer (L) contains, as the photosensitive component, a compound possessing two or more aromatic and/or heteroaromatic o-nitrocarbinol ester groups of the general formula (I)

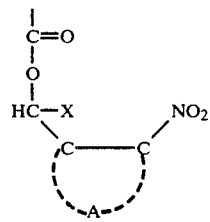

wherein A is a radical of an unsubstituted or substituted 5-membered to 14-membered aromatic or heteroaromatic ring system, and X is hydrogen, alkyl of 1 to 8 carbon atoms or an unsubstituted or substituted aryl or aralkyl radical.

The aromatic or heteroaromatic ring system A containing the nitro group in the ortho-position can be mononuclear or polynuclear. A particularly preferred aromatic ring system is benzene, and the benzene ring can be monosubstituted or polysubstituted, for example by $C_1$–$C_8$-alkyl, in particular methyl, by $C_1$–$C_6$-alkoxy, in particular methoxy, by halogen, eg. chlorine or bromine, or by nitro, amino, monomethylamino, dimethylamino, nitrile or sulfo. Examples of polynuclear aromatic ring systems are naphthalene, anthracene, anthraquinone, phenanthrene and the corresponding substituted derivatives. A preferred heteroaromatic ring system is the pyridine radical. X is, in particular, hydrogen, methyl, ethyl or unsubstituted or substituted phenyl.

Examples of particularly preferred aromatic or heteroaromatic o-nitrocarbinols from which the o-nitrocarbinol ester groups of the general formula (I) are derived are o-nitrobenzyl alcohol, 2-nitro-6-chlorobenzyl alcohol, 2-nitro-4-cyanobenzyl alcohol, 2-nitro-4,5-dimethoxybenzyl alcohol, α-methyl-o-nitrobenzyl alcohol, α-phenyl-o-nitrobenzyl alcohol, α-(o-nitrophenyl)-o-nitrobenzyl alcohol and 2-nitro-3-hydroxymethylpyridine.

Suitable compounds containing aromatic and/or heteroaromatic o-nitrocarbinol ester groups are low molecular weight esters possessing two or more ester groups of the general formula (I). These include, in particular, the diesters and/or polyesters of low molecular weight dicarboxylic acids and/or polycarboxylic acids with aromatic and/or heteroaromatic o-nitrocarbinols of the type discussed. Examples of low molecular weight dicarboxylic acids and polycarboxylic acids from which such esters can be derived are oxalic acid, malonic acid, adipic acid, maleic acid, fumaric acid, crotonic acid, terephthalic acid, trimellitic acid and trimesic acid.

If low molecular weight compounds containing o-nitrocarbinol ester groups of the formula (I) are employed as the photosensitive component, the photosensitive layer (L) advantageously also contains a polymeric binder which is compatible with these esters; for example, acrylate and/or methacrylate polymers have proved particularly useful for this purpose. Other particularly suitable polymeric binders for the photosensitive layer (L) are the high molecular weight compounds described below, which effect crosslinking and possess groups which are reactive to carboxyl groups. Where low molecular weight compounds containing o-nitrocarbinol ester groups of the formula (I) are used as the photosensitive component, the amount of these in the photosensitive layer (L) is such that exposure to actinic light results in the formation of a number of free carboxyl groups which is sufficient to achieve the desired degree of crosslinking and hardening during thermal hardening and crosslinking of the layer (L). For this purpose, it is generally sufficient if the said layer contains from 2 to 30, in particular from 10 to 15, % by weight, calculated as —COO— and based on the total photosensitive layer (L), of the aromatic and/or heteroaromatic o-nitrocarbinol ester groups of the formula (I).

Photosensitive layers (L) which have proved particularly useful in the novel process for the production of gravure printing plates are those which contain, as the photosensitive component, a polymer which has a molecular weight of above 500 and containers not less than 5% by weight, based on the molecular weight of the polymer, of aromatic and/or heteroaromatic o-nitrocarbinol ester groups of the general formula (I) bonded in the molecule. Regarding these polymers and their preparation, reference may be made, in particular, to German Laid-Open Application No. DOS 2,150,691.

An advantageous o-nitrocarbinol ester-containing polymer is an organic polycarboxylic acid whose carboxyl groups are esterified with the aromatic and/or heteroaromatic o-nitrocarbinols of the type under discussion. The organic polycarboxylic acids are in general homopolymers or copolymers of ethylenically unsaturated mono- or dicarboxylic acids of 2 to 6 carbon atoms, in particular of acrylic acid, methacrylic acid, maleic acid, fumaric acid or crotonic acid. Particularly important comonomers are ethylene, styrene and the $C_1$–$C_8$-alkyl esters of the above ethylenically unsaturated carboxylic acids.

It should be pointed out that virtually all carboxyl groups of the o-nitrocarbinol ester-containing polycarboxylic acid must be esterified or be present in a form which cannot react directly with the reactive groups of the crosslinking component described below, if it is desired that the photosensitive material as such, or the photosensitive layer (L) applied to the printing plate base, have a long shelf life in the dark or in yellow light. Otherwise, there is a danger that the photosensitive material will undergo partial crosslinking and hardening even before exposure to actinic light, for example during storage, with the result that it would only be of limited use for the novel process.

The amount of o-nitrocarbinol ester groups of the formula (I) incorporated in the polymer is in general not less than 5% by weight, based on the molecular weight of the polymer, and can vary within wide limits, depending on the desired properties of the photosensitive layer (L) or of the printing layer produced therefrom. During exposure to actinic light, the o-nitrocarbinol ester groups undergo cleavage, and free carboxyl groups are formed in the polymer, with the result that the solubility of the latter is changed; hence, for example, the content of o-nitrocarbinol ester groups of the general formula (I) in the polymer is chosen so that these polymers, after exposure of the photosensitive layer (L), are soluble or dispersible in aqueous solvents, eg. water or aqueous alkaline solutions, and can be washed out with these. The content of the said o-nitrocarbinol ester groups in the polymer should also be adapted to the degree of crosslinking desired in the thermal hardening of the layer (L).

The photosensitive layer (L) employed in the novel process also contains one or more compounds which effect crosslinking and contain two or more reactive groups which are capable of reacting with —COOH groups under the action of heat to form a covalent chemical bond. Since according to the various embodiments of the novel process washout of the photosensitive layer (L) takes place after exposure to actinic light, the reactivity of the said reactive groups should be adapted to the other process conditions, in particular the duration of, and the temperature required for, the development, so as to ensure that, after exposure to actinic light, the layer (L) can still be satisfactorily washed out with the aqueous developer. The photosensitive layer (L) therefore preferably contains those crosslinking compounds which react with the free carboxyl groups at an appreciable rate only at elevated temperatures, for example at above 40° C. Examples of reactive crosslinking groups of the type under discussion which are particularly useful for the novel process are amine, imine, amide, epoxide, hydroxyl and/or blocked or unblocked isocyanate groups.

In one embodiment of the novel process, the photosensitive layer (L) used can contain the aromatic and/or heteroaromatic o-nitrocarbinol ester groups of the general formula (I) and the crosslinking reactive groups of the above type bonded in one and the same molecule. Such compounds are, in particular, copolymers which carry aromatic and/or heteroaromatic o-nitrocarbinol ester groups and which contain, as copolymerized units, comonomers possessing the crosslinking groups reactive to carboxyl groups, eg. amine, imine, amide, epoxide, hydroxyl and/or blocked or unblocked isocyanate groups. Particularly suitable comonomers of this type are those containing epoxide, hydroxyl, isocyanate and/or blocked isocyanate groups, for example, N,N-dimethylaminoethyl acrylate or methacrylate; N-vinylimidazole; acrylamide or methacrylamide; and preferably glycidyl esters of unsaturated acids, in particular of acrylic acid or methacrylic acid, such as glycidyl acrylate or methacrylate; glycidyl ethers of unsaturated alcohols, such as allyl glycidyl ether or 4-vinylcyclohexene dioxide; vinyl isocyanate or allyl isocyanate; monoesters of diols with unsaturated acids, in particular with acrylic acid or methacrylic acid, such as hydroxyethyl acrylate or methacrylate, hydroxypropyl acrylate or methacrylate or butanediol monoacrylate or monomethacrylate; and methylol compounds of the amol type, eg. N-methylolacrylamide.

In another embodiment of the invention, the photosensitive layer (L) can contain the crosslinking compounds, which possess reactive groups, in addition to the compounds containing aromatic and/or heteroaromatic o-nitrocarbinol ester groups. In this case, the crosslinking compounds can be high molecular weight compounds, eg. appropriate polymers, or appropriate low molecular weight compounds. If the said crosslinking compounds are introduced into the photosensitive layer (L) as components of the mixture, they should be compatible with the compounds containing the aromatic and/or heteroaromatic o-nitrocarbinol ester groups. Preferred classes of cross-linking compounds which possess two or more reactive groups and can be present as such components in the photosensitive layer (L) are diepoxides or polyepoxides, free or blocked di- or polyisocyanates, carbodiimides, dihydroxides or polyhydroxides and diamines or polyamines. The photosensitive layer (L) may contain one or more of the crosslinking compounds, for example two or more different crosslinking compounds, such as epoxides, isocyanates and/or blocked isocyanates.

The diepoxides or polyepoxides include the reaction products of epichlorohydrin with polyols, the reaction products of epichlorohydrin with polyamines, polyolefin-epoxides, epoxidized polybutadiene, epoxy resins of the novolak type, high polymers of glycidyl esters of unsaturated carboxylic acids, in particular of acrylic acid or methacrylic acid, and other compounds. Of particular interest are the epoxides based on epichlorohydrin and bisphenol A. Another group of suitable epoxides are those in which the terminal glycidyl groups are bonded via aliphatic or araliphatic radicals. A typical member of this class is the diglycidyl ether of butane-1,4-diol. For example, owing to the less rigid molecular structure, epoxides of this type lead to more flexible hardened products. If, instead of the polyhydric alcohols, amines are used with epichlorohydrin for the preparation of the epoxide compounds, epoxypropylamines having a structure similar to that of the glycidyl ethers are obtained. A typical compound of the glycidyl ethers are obtained. A typical compound of this type is bis(epoxypropyl)aniline, which, because of its extremely low viscosity, can be employed as a bifunctional diluent. Important high molecular weight crosslinking compounds include epoxy resins of the novolak type. Because of their high functionality, they react with the photochemically produced carboxylic acid groups to give highly crosslinked systems having high heat distortion resistance. The same applies where polyglycidyl acrylates or methacrylates or other glycidyl-containing polymers are used.

If a cycloaliphatic epoxide whose molecule contains one or more cycloaliphatic rings but no aromatic rings is employed, it is possible, for example, to increase the shelf life and the stability to UV light. In the cycloaliphatic epoxides, the epoxide oxygen can be bonded exclusively to the cycloaliphatic rings, as, for example, in dicyclopentadiene dioxide, exclusively in the side-chains, as, for example, in the diglycidyl ester of hexahydrophthalic acid, or to the cyclic rings as well as the side-chains, as, for example, in vinylcyclohexane dioxide.

Other suitable crosslinking compounds are the conventional polyisocyanates containing two or more isocyanate groups per molecule, for example alkyl and cycloalkyl diisocyanates where alkyl or cycloalkyl is preferably of 4 to 41 carbon atoms, such as dimeric acid diisocyanate, isophorone diisocyanate, dicyclohexylmethane diisocyanate, butane-1,4-diisocyanate, hexamethylene diisocyanate, heptadecane diisocyanate, 2,2,4-trimethylhexamethylene diisocyanate or 2,6-diisocyanatomethyl caproate, isocyanurate-isocyanates, eg. the product from the reaction of toluylene 2,4-diisocyanate with hexamethylene diisocyanate, biurets, eg. hexamethylene diisocyanate biuret, aryl diisocyanates and triisocyanates, eg. toluylene diisocyanate, diphenylmethane diisocyanate, naphthylene diisocyanate, triphenylmethane triisocyanate or xylylene diisocyanate, mixed aliphatic/aromatic di- and triisocyanates, di- and triisocyanates containing functional groups, eg. carbonylisocyanates, such as carbonyl diisocyanate or isophthaloyl diisocyanate, sulfaryl isocyanates, sulfonyl diisocyanate, m-phenylenedisulfonyl diisocyanate, allophanate isocyanates, heteroatom-containing di- and triisocyanates, eg. reaction products of hexamethylcyclotrisilazane and diphenylmethane diisocyanate, as well as isocyanate-containing polymers, eg. copolymers of vinyl isocyanate, and hydroxyl- and/or amino-containing polymers or polycondensates which have been reacted with an excess of a di- or triisocyanate.

Since, in the novel process, the photosensitive layer (L) is brought to a state in which it can be hardened by heat only as a result of the action of actinic light, it is not necessary for the isocyanate component to be blocked in order for the photosensitive material to have a long shelf life before it is processed by the method according to the invention. However, if in the process according to the invention it is desired to have a high degree of latitude in the development of the exposed layer (L) it is advantageous to use blocked isocyanates ad the crosslinking components in the said layer. The blocked isocyanates undergo cleavage only at elevated temperatures to give the starting components once again, so that when such isocyanates are used as crosslinking compounds the layer (L), after exposure to actinic light, is completely inert at room temperature and hence permits very great latitude in processing.

Suitable protective components for blocking the isocyanates are mainly phenols, acetone-oxime, methyl ethyl ketoxime, ethyl acetoacetate or malonic ester; however, compounds such as acetylacetone, phthalimide, caprolactam, benzenesulfonamide and 2-mercaptobenzothiazole are also suitable. A very suitable, highly effective blocked isocyanate compound is obtained, for example, from one mole of trimethylolpropane, 3 moles of 2,4-diisocyanatotoluene and 3 moles of phenol. Another example of a blocked isocyanate is the isocyanurate derivative obtained by trimerization of the reaction product of 2,4-diisocyanatotoluene with cresol. The blocked isocyanates prepared from toluylene diisocyanate, trimethylolpropane, butane-diol and cresol are likewise very suitable crosslinking compounds.

Because they react readily with carboxylic acid groups, another group of very useful crosslinking compounds comprises the conventional carbodiimides, as formed by carbodiimidization of diisocyanates. If an $\alpha,\omega$-diisocyanatopolycarbodiimide is employed as the crosslinking compound, hardening the layer (L) in accordance with the invention gives a dense network with the formation of polyacylurea. The carbodiimides can be based on either aromatic or aliphatic diisocyanates. One of the reasons why $\alpha,\omega$-diisocyanatopolycarbodiimides obtained from isophorone diisocyanate are particularly suitable as crosslinking compounds in the novel process is because, as blocked polyisocyanates, they ensure substantial processing latitude in the development of the layer (L).

Advantageous crosslinking compounds containing two or more reactive groups also include polymers containing hydroxyl or amino groups, for example phenol-formaldehyde resins, urea-formaldehyde resins and melamine-formaldehyde resins. Particularly suitable compounds of this class are the novolaks. Examples of other polymeric compounds which effect crosslinking are the polyglycidyl acrylates and methacrylates.

The high molecular weight crosslinking compounds containing the reactive groups are preferably used in the photosensitive layer (L) when the o-nitrocarbinol ester-containing compounds have a relatively low molecular weight. Where the o-nitrocarbinol ester-containing compound is a polymer having a high molecular weight, the added crosslinking compounds containing reactive groups can have either a low or a high molecular weight.

The ratio of the reactive groups in the crosslinking compounds to the o-nitrocarbinol ester groups of the general formula (I) in the compounds containing these groups can be varied within wide limits so that the desired degree of crosslinking and hardening of the layer (L), and hence the desired mechanical properties and resistance to solvents, are achieved.

The photosensitive layers (L) employed in the novel process can also contain other conventional additives and assistants. These can, on the one hand, be compounds which facilitate the production of the photosensitive layer (L), eg. plasticizers or flow improvers. Examples of plasticizers, which are added particularly when the photosensitive layer (L) is to be applied to the printing plate base by lamination and should be compatible with the o-nitrocarbinol ester-containing compounds, are tricresyl phosphate, n-butylbenzyl phthalate and liquid polyesters obtained from an aliphatic dicarboxylic acid and bifunctional glycol, in particular polyesters obtained from adipic acid and propylene 1,2-glycol or butane-1,4-diol and having a viscosity of from 1,000 to 15,000 cP. If the crosslinking compounds which possess two or more reactive groups and are employed as components of the mixture are low molecular weight substances, these can also act as plasticizers and make the addition of separate plasticizing compounds partially or completely superfluous. The use of flow improvers, eg. silicone oils, is particularly advisable if the photosensitive layer is to be applied to a base by casting from solution.

On the other hand, the photosensitive layer (L) can contain additives which improve or modify its performance characteristics. These include, for example, catalysts which accelerate the thermal hardening of the exposed layer (L), ie. the reaction of the free carboxyl groups with the reactive groups of the crosslinking compounds; sensitizers which improve the photosensitivity and the spectral sensitivity of the layer (L); and dyes, pigments and/or photochromic substances, as well as finely divided fillers.

Depending on the type of crosslinking compound used, suitable catalysts for the thermal hardening of the layer (L) are the acids and bases conventionally used for such reactions. However, it should be noted that this generally restricts the latitude in the development of the layer (L), so that the amount of catalyst is in general kept small. In some cases, it is sufficient to add an amount of catalyst in the ppm range. Examples of basic catalysts are benzyldimethylamine, benzyltrimethylammonium hydroxide, diazabicyclooctane, N,N,N',N'-tetramethyl-1,3-diaminobutane, 2-dimethylamino-2-hydroxypropane, 2-dimethylaminomethylphenol, 2,4,6-tri-(dimethylaminoethyl)-phenol, organo-tin compounds, such as tin octoate, etc.

Examples of sensitizers are xanthene dyes, such as fluorescein, eosin and rhodamine S, as well as triplet sensitizers, as described, for example, by N. J. Turro in "Molecular Photochemistry", W. A. Benjamin Inc., New York 1967, page 132. Dyes which have proved useful for incorporation into the photosensitive layer (L) include Sudan dyes, polymethine dyes, azo dyes, phthalocyanine dyes and disperse dyes, as well as eosin, crystal violet and malachite green. Particularly advantageous dyes are those which undergo a reversible or irreversible color change on exposure to actinic light. For example, Sudan dyes, polymethine dyes or azo dyes are bleached out by added photoinitiators, such as benzoin ethers, benzil ketals, benzophenone or Michler's ketone, in the photosensitive layer, according to the imagewise exposure. The polymethine dyes of the general formula (II)

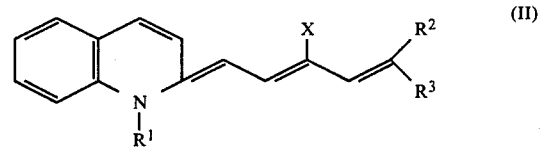

where $R^1$ is alkyl, $R^2$ is —CN, $R^3$ is —CN, —COOR$^4$ or —Ph—R$^5$, $R^4$ is alkyl, $R^5$ is —NO$_2$, halogen, alkyl or alkoxy and X is halogen, deserve special mention.

In a particular embodiment of the invention, the photosensitive layer (L) can contain, as additives, finely divided fillers, in particular finely divided abrasive fillers, as described in the copending U.S. patent application Ser. No. 400,136, filed July 20, 1982, of the same assignee. Addition of these finely divided abrasive fillers can increase, in particular, the hardness of the layer (L) and hence the scratch-resistance and abrasion-resistance of the resulting gravure printing plates. Moreover, suitable fillers can also result in an improvement in other properties of the layer (L), eg. flow properties, rigidity, etc. The mean particle size of the finely divided filler is preferably from 0.1 to 6 μm, and it is advantageous if not more than 5%, preferably less than 1%, of the particles of this filler have maximum linear dimensions >10 μm. If finely divided abrasive fillers are added to the photosensitive layer (L), their hardness should be in general >4.0, advantageously 6 or more, on Mohs' hardness scale. These fillers are, in particular, mineral fillers and pigments, eg. silicon dioxides, especially quartz flour and cristobalite, silicates, especially aluminum silicates and silicate glasses, aluminum oxides, especially corundum, and titanium dioxide, silicon carbide, tungsten carbide, etc. The finely divided fillers, in particular the finely divided abrasive fillers, may be present in the entire photosensitive layer (L); however, to produce gravure printing plates having the desired properties, it is frequently sufficient if the fillers are present only in a thin surface zone about 1–50, preferably 5–20, μm thick, measured from the surface of the layer (L) which constitutes the subsequent surface of the printing layer.

As stated above, the photosensitive layer (L) is first applied onto the printing plate base by a conventional coating technique, for example by casting the said layer from solution. Where a sheet-like base is used for the production of the printing plate, it has proved advantageous to laminate the photosensitive layer (L) onto this base, for example by first producing the photosensitive layer (L) on a temporary base and then transferring it to the sheet-like base, using pressure with or without the application of heat. It is advantageous if the photosensitive layer (L) is produced so that its surface has a peak-to-valley height of, in particular, <2 μm, preferably <1 μm.

If the photosensitive layer (L) is applied onto the printing plate base by a lamination process, it can be advantageous to pre-expose this layer, before lamination, uniformly to actinic light for a short time. This pre-exposure is preferably carried out from that side of the photosensitive layer (L) which is subsequently applied to the printing plate base, and can last for as long as 70% of the time for the subsequent principal imagewise exposure. This pre-exposure leads, inter alia, to improved adhesion of the photosensitive layer (L) on metallic printing plate bases.

To produce the gravure printing plate, the photosensitive layer (L) is, in accordance with the invention, exposed imagewise to actinic light through a suitable image-bearing transparency in a conventional manner. Suitable light sources for this purpose are those which emit actinic light having a wavelength of from 200 to 600 nm, preferably from 300 to 420 nm, eg. carbon arc lamps, high-pressure mercury lamps, high-pressure xenon lamps and in particular low-pressure mercury fluorescence lamps. The times for the imagewise exposure are in general about 0.05–50 minutes. In a particularly advantageous embodiment, the imagewise exposure of the photosensitive layer (L) can be effected with a controlled and modulated actinic laser beam, eg. a UV laser.

A particular advantage of the novel process is its great flexibility, which, depending on the particular conditions and requirements, permits the use of any desired image-bearing transparency. For example, imagewise exposure in the novel process can be effected either through a screen positive or line positive or through a screen negative or line negative. It is also possible, for example, to expose the photosensitive layer (L) through a continuous tone negative and a screen negative or line negative simultaneously.

Depending on the choice of the image-bearing transparency for the imagewise exposure, the sequence of the subsequent process steps in the novel process may vary. If, for example, the photosensitive layer (L) is exposed through a screen negative or line negative, the exposed areas are first washed out with an aqueous developer. The stability, abrasion-resistance and scratch-resistance of the layer (L) are then increased by subjecting the layer to uniform post-exposure to actinic light and then subjecting it to thermal hardening and crosslinking. The uniform post-exposure results, in the areas of the layer which have not been washed out, in cleavage of the o-nitrocarbinol ester groups to form carboxyl groups, which then react with the crosslinking compound at elevated temperatures; this imparts improved mechanical stability and solvent-resistance to the layer (L). This procedure gives an intaglio half-tone plate. If a gravure printing plate having wells of variable depth is required, the layer can be exposed through a continuous tone negative and a screen negative or line negative simultaneously, the subsequent process steps being carried out as described above.

If the photosensitive layer (L) is exposed through a screen positive or line positive, the exposed areas are first subjected to selective thermal hardening and crosslinking. The non-crosslinked areas of the layer (L) can then be washed out directly with a suitable developer; however, the layer (L) is advantageously first postexposed once again uniformly to actinic light and then washed out with an aqueous developer. In the latter case, and in a particular embodiment of the novel process, the layer (L), after having been washed out with the aqueous developer, can once again be post-cured and subsequently crosslinked.

It is also possible to use a combination of these two versions of the process, wherein the non-printing areas and projections are first exposed through a screen positive or line positive, these exposed areas are subjected to selective thermal hardening and crosslinking and the wells are then formed by exposure through a continuous tone negative or screen negative and by washing out and hardening the layer (L).

The developers employed in the novel process are, in particular, aqueous developers. This can be water as such or a mixture of water with a water-soluble organic solvent, for example a mixture of water with an aliphatic alcohol, in particular methanol or ethanol, a ketone, eg. acetone, or a cyclic ether, eg. tetrahydrofuran. In particular, water is employed as the developer. The pH of the developer is advantageously higher than 7.5, and some or all of the free carboxyl groups are therefore converted to the salt form. The optimum amount of alkali, or the pH, is of course dependent on the layer material used and on the exposure time and intensity, ie. on the amount of free carboxyl groups formed as a result of the exposure. Alkalis which can be added to the developer are, for example, borax, disodium hydrogen phosphate, sodium carbonate or alkali metal hydroxides, and examples of suitable organic bases are diethanolamine and triethanolamine. For example, surfactants, sodium carboxymethylcellulose, polyvinyl alcohol, polysodium acrylate, etc. can also be added to the washout solution. The layer (L) can be washed out in a conventional manner, for example by spraying, rubbing out or brushing out with the aqueous developer. To accelerate the development process, it is possible to employ elevated temperatures, for example as high as about 40° C., depending on the crosslinking compound present in the layer (L). The development time is generally a few minutes.

Suitable light sources for the uniform post-exposure of the layer (L) are those used for the above-mentioned imagewise exposure. The duration of the uniform post-exposure is in general from 0.05 to 50 minutes. It is generally carried out using such an intensity and for such a period that the number of free carboxyl groups formed in the layer (L) is sufficient to meet the requirements of the subsequent thermal hardening and crosslinking or the subsequent washout with the aqueous developer.

Thermal hardening and crosslinking of the layer (L) can be carried out at room temperature, but very long hardening times are generally required in this case. Advantageously, therefore, hardening and crosslinking are carried out at elevated temperatures, by heating the layer (L), preferably at from 50° to 250° C., in particular from 60° to 200° C. The time required for hardening and crosslinking, which can be from about 10 minutes to a few hours, eg. 5 hours, depends on the type and reactivity of the crosslinking compounds employed, on the number of free carboxyl groups produced during exposure, on the desired degree of crosslinking and hardening, etc. For example, crosslinking of the free carboxyl groups with epoxide compounds requires relatively high hardening temperatures. For example, an equimolar non-catalyzed mixture of a carboxylic acid and a diepoxide based on 2,2-bis-(p-hydroxyphenyl)-propane has to be heated for from 2 to 4 hours at about 150°–200° C. to convert all of the epoxide groups. The hardening can also be carried out stepwise, for example using an excess or less than the stoichiometric amount of an epoxide compound or quite generally of the crosslinking compounds, for example by first heating the mixture to not more than above 150° C. and then carrying out final hardening at above 150° C., in particular at about 200° C. or above. Thermal hardening and crosslinking of the layer (L) is generally carried out so that the non-printing areas of this layer generally have a Vickers hardness, measured under load, of not less than 10 N/mm², preferably not less than 50 N/mm², in particular not less than 100 N/mm². The Vickers hardness under load is determined by the method described in "Kunststoffe", 60(1970), 265–273.

The gravure printing plates produced according to the invention are very hard and very abrasion-resistant and permit long print runs with minimum abrasion. Surface scratches can be polished away. Steel doctor blades can be used without the surface of the gravure printing plate being damaged so as to affect the printed image. Moreover, the gravure printing plates produced according to the invention have improved resistance to printing inks, even to alcoholic printing inks. The particular advantage of these plates is that they can be produced by a simple and economical method, and can be employed on conventional gravure printing presses. Even in the case of long print runs (from 500,000 to 1,000,000), they give copies of good print quality, even as regards the continuous tone reproduction.

The Examples which follow illustrate the invention. Parts are by weight, unless stated otherwise.

EXAMPLE 1

72 parts of a methyl methacrylate copolymer, containing 25 parts of o-nitrobenzyl acrylate as copolymerized units, 27 parts of a bisphenol A diglycidyl ether (®Epikote 828 from Shell), 0.7 part of benzil dimethyl ketal, 0.1 part of a black dye and 0.2 part of a polymethine dye of the general formula (II), where $R^1$ is methyl, $R^2$ is nitrile, $R^3$ is —COOEt and X is chlorine, were dissolved in 160 parts by volume of ethyl acetate. A photosensitive layer was cast from this solution onto a polyethylene terephthalate film (temporary base), so that a layer about 50 μm thick required after removal of the solvent and drying. The free surface of the resulting photosensitive layer was laminated, at 100° C., onto a copper sheet. The polyester film was removed, and the photosensitive layer was then exposed to actinic light through a screen negative. The exposed image areas were washed out in the course of 20 minutes with a developer comprising 81% of water, 16% of 2-butoxyethanol and 3% of triethanolamine. The plate was then post-exposed uniformly, and heated successively at 60° C., 80° C., 120° C. and 150° C. for one hour in each case.

The resulting gravure printing plate gave a fully satisfactory print. The plate was tested in an AT II type abrasion tester from Burda. After 1 million cycles of the doctor plate, the printing plate showed scarcely any signs of damage and still gave a good print.

EXAMPLE 2

The procedure described in Example 1 was followed, except that in this case the photosensitive layer was exposed through a screen positive. The layer was then heated at increasing temperatures (60° C., 80° C., 120° C. and 150° C. for 1 hour in each case) in order to effect crosslinking in the exposed areas of the layer. After heating, the layer was post-exposed uniformly, and the non-crosslinked areas were removed with the same developer as that used in Example 1. The printing plate was then heated once again at 150° C. for 1 hour.

The printing plate was tested in an AT II type abrasion tester from Burda. After 1 million cycles of the doctor plate, the plate showed scarcely any signs of damage and gave a very good print.

EXAMPLE 3

The procedure described in Example 1 was followed, except that in this case the photosensitive layer was exposed through a screen negative and a continuous tone negative simultaneously. Subsequent further processing was carried out as described in Example 1. The wells of the finished gravure printing plate differed in depth, depending on the tonality. The plate gave excellent printing results, in particular very good continuous tone reproduction.

EXAMPLE 4

The procedure described in Example 1 was followed, except that in this case the photosensitive layer was produced from 65 parts of the methyl methacrylate copolymer from Example 1, 25 parts of ®Epikote 828 and 10 parts of quartz flour (particle size 10μ). Exposure, development and hardening of the photosensitive layer was carried out as described in Example 1. The resulting gravure printing plate was completely undamaged after one million cycles of the doctor plate in the AT II type abrasion tester from Burda.

We claim:

1. A process for the production of a gravure printing plate having a plastic printing layer applied to a printing plate base, which comprises:
   (a) subjecting a solid photosensitive layer (L), which is firmly bonded to said base, to imagewise exposure to actinic light, the said photosensitive layer (L) containing as the photosensitive component, a compound possessing two or more aromatic and/or heteroaromatic o-nitrocarbinol ester groups of the formula (I)

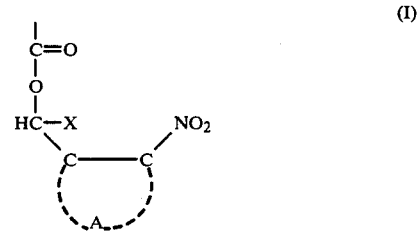

where A is a radical of an unsubstituted or substituted 5-membered to 14-membered aromatic or heteroaromatic ring system and X is hydrogen, alkyl of 1 to 8 carbon atoms or an unsubstituted or substituted aryl or aralkyl radical, said layer (L) further containing a compound which effects cross-linking and possesses two or more reactive groups, which, under the action of heat, are capable of reacting with —COOH groups to form a covalent chemical bond; and thereafter either (b) first washing out the imagewise exposed layer (L) with an aqueous developer, post-exposing the washed-out layer uniformly to actinic light and afterwards subjecting it to thermal hardening and cross-linking, or (c) first subjecting the imagewise exposed layer (L) to selective thermal hardening and cross-linking in the exposed areas, post-exposing the selectively hardened and cross-linked layer (L) uniformly to actinic light and thereafter washing it out with an aqueous developer.

2. The process of claim 1, wherein the photosensitive layer (L) contains a compound possessing o-nitrocarbinol ester groups of the formula (I), in which the carbinol on which the o-nitrocarbinol ester groups of the formula (I) are based is o-nitrobenzyl alcohol, 2-nitro-6-chlorobenzyl alcohol, 2-nitro-4-cyanobenzyl alcohol, 2-nitro-4,5-dimethoxybenzyl alcohol, α-methyl-o-nitrobenzyl alcohol, α-phenyl-o-nitrobenzyl alcohol or α-(o-nitrophenyl)-o-nitrobenzyl alcohol.

3. The process of claim 1, wherein the photosensitive layer (L) contains, as the compound possessing the o-nitrocarbinol ester groups of the formula (I), a di- and/or polyester of a low molecular weight di- and/or polycarboxylic acid and in addition a polymeric binder which is compatible with these esters.

4. The process of claim 1, wherein the photosensitive layer (L) contains a polymer which has a molecular weight of above 500 and contains not less than 5% by weight, based on the molecular weight of the polymer, of aromatic and/or heteroaromatic p-nitrocarbinol ester groups of the formula (I) bonded in the molecule.

5. The process of claim 1, wherein the photosensitive layer (L) contains a polymer which possesses o-nitrocarbinol ester groups of the formula (I) and is derived from a homopolymer or copolymer of acrylic acid, methacrylic acid, maleic acid, fumaric acid and/or crotonic acid.

6. The process of claim 1, wherein the photosensitive layer (L) contains a compound, in particular a polymer, which, in addition to the o-nitrocarbinol ester groups of the formula (I), also contains the crosslinking reactive groups incorporated in the molecule.

7. A process as claimed in claim 6, wherein the compound possessing o-nitrocarbinol ester groups of the formula (I) contains, as crosslinking reactive groups, amine, imine, amide, epoxide, hydroxyl, isocyanate and/or blocked isocyanate groups.

8. The process of claim 1, wherein the photosensitive layer (L) contains, in addition to the compound possessing the o-nitrocarbinol ester groups of the formula (I), one or more crosslinking compounds possessing two or more reactive groups of the type mentioned.

9. A process as claimed in claim 8, wherein the photosensitive layer (L) contains, as crosslinking compounds, epoxides, isocyanates, blocked isocyanates, α,ω-diisocyanatopolycarbodiimides, alcohols and/or amines.

10. The process of claim 1, wherein the photosensitive layer (L) is from 5 to 500 μm thick.

11. The process of claim 1, wherein the photosensitive layer (L) contains further additives and/or assistants.

12. A process as claimed in claim 11, wherein the photosensitive layer (L) contains plasticizers, flow improvers, catalysts for thermal hardening, sensitizers, dyes, pigments and/or photochromic substances.

13. A process as claimed in claim 11, wherein the photosensitive layer (L) contains, in a surface zone of from 1 to 50 μm, or throughout, a finely divided filler.

14. A process as claimed in claim 13, wherein the finely divided filler has a mean particle size of from 0.1 to 6 μm and a hardness >4.0 on Mohs' hardness scale.

15. The process of claim 1, wherein thermal hardening and crosslinking of the layer (L) which has been exposed to actinic light is carried out at from 50° to 250° C.

16. The process of claim 1, wherein the photosensitive layer (L) is exposed imagewise to actinic light through a screen negative or line negative, the exposed areas of this layer are washed out with an aqueous developer, and the said layer is post-exposed uniformly to actinic light and then subjected to thermal hardening and crosslinking.

17. A process as claimed in claim 16, wherein the photosensitive layer (L) is exposed through a continuous tone negative and a screen negative or line negative simultaneously.

18. The process of claim 1, wherein the photosensitive layer (L) is first exposed imagewise to actinic light through a screen positive or line positive, the exposed areas of this layer are subjected to selective thermal hardening and crosslinking, the said layer is then exposed imagewise to actinic light through a continuous tone negative or screen negative, the areas of the layer (L) which have been exposed during the second imagewise exposure are washed out with an aqueous developer and finally the layer (L) is post-exposed uniformly to actinic light and subjected to thermal hardening and crosslinking.

19. The process of claim 1, wherein exposure of the photosensitive layer (L) is carried out using a controlled and modulated actinic laser beam.

20. The process of claim 1, wherein the photosensitive layer (L) is exposed imagewise to actinic light through a screen positive or line positive, the exposed areas are subjected to selective thermal hardening and cross-linking after which the said layer is post-exposed uniformly to actinic light and then washed out with an aqueous developer.

* * * * *

UNITED STATES PATENT AND TRADEMARK OFFICE
CERTIFICATE OF CORRECTION

PATENT NO. : 4,565,771
DATED : January 21, 1986
INVENTOR(S) : John LYNCH et al.

It is certified that error appears in the above—identified patent and that said Letters Patent is hereby corrected as shown below:

Claim 4, col. 15, line 21, change "p-nitrocarbinol" to --o-nitrocarbinol--.

Claim 5, col. 15, line 23, change "claim 1" to --claim 4--.

Signed and Sealed this

Fifteenth Day of April 1986

[SEAL]

Attest:

DONALD J. QUIGG

Attesting Officer

Commissioner of Patents and Trademarks